United States Patent [19]

Ahn et al.

[11] Patent Number: 5,593,720
[45] Date of Patent: Jan. 14, 1997

[54] PROCESS FOR MAKING A MULTILEVELED ELECTRONIC PACKAGE

[75] Inventors: Kie Y. Ahn, Chappaqua, N.Y.; James L. Hedrick, Jr., Pleasanton; Jeffrey W. Labadie, Sunnyvale, both of Calif.; Kang-Wook Lee, Yorktown Heights, N.Y.; Robert J. Twieg, San Jose, Calif.; Alfred Viehbeck, Fishkill; George F. Walker, New York, both of N.Y.

[73] Assignee: IBM Corporation, Armonk, N.Y.

[21] Appl. No.: 447,564

[22] Filed: May 23, 1995

Related U.S. Application Data

[62] Division of Ser. No. 319,392, Oct. 6, 1994, Pat. No. 5,516,874, which is a continuation of Ser. No. 268,422, Jun. 30, 1994, abandoned.

[51] Int. Cl.⁶ .................................................. B05D 5/12
[52] U.S. Cl. .................. 427/97; 427/316; 427/372.2; 427/379; 427/384; 427/407.1; 29/846; 29/855; 428/901
[58] Field of Search .................. 427/97, 316, 335, 427/372.2, 379, 384, 402, 407.1; 29/855, 825, 846; 428/458, 473.5, 901

[56] References Cited

U.S. PATENT DOCUMENTS

| | | | |
|---|---|---|---|
| 3,247,165 | 4/1966 | Rodia | 260/65 |
| 3,361,589 | 1/1968 | Lindsey . | |
| 3,533,879 | 10/1970 | Levine . | |
| 3,770,573 | 11/1973 | Dunphy et al. . | |
| 3,957,726 | 5/1976 | Gordon et al. . | |
| 4,022,649 | 5/1977 | Nakagome et al. . | |
| 4,048,005 | 9/1977 | Nakagome et al. . | |
| 4,670,325 | 6/1987 | Bakos et al. | 427/97 |
| 4,983,252 | 1/1991 | Masui et al. | 156/630 |
| 5,077,084 | 12/1991 | Konotsune et al. | 427/96 |
| 5,120,819 | 6/1992 | Lubowitz et al. . | |
| 5,180,639 | 1/1993 | Zarnoch . | |
| 5,317,078 | 5/1994 | Connell et al. . | |
| 5,418,066 | 5/1995 | Chen et al. | 428/458 |

*Primary Examiner*—Shrive Beck
*Assistant Examiner*—Brian K. Talbot
*Attorney, Agent, or Firm*—Scully, Scott, Murphy & Presser

[57] ABSTRACT

A multilevel electronic package comprising at least two levels, each level including a poly(aryl ether benzimidazole), a polymide and copper. A process of preparing this package is disclosed. Several novel poly(aryl ether benzimidazoles) useful in preparing this package are also set forth.

8 Claims, No Drawings

PROCESS FOR MAKING A MULTILEVELED ELECTRONIC PACKAGE

This is a divisional of application Ser. No. 08/318,392, filed on Oct. 6, 1994, now U.S. Pat. No. 5,516,874, which is a continuation application of U.S. Ser. No. 08/268,422, filed on Jun. 30, 1994, now abandoned.

BACKGROUND OF THE DISCLOSURE

1. Field of the Invention

The present invention is directed to an electronic multilevel package which includes a poly(aryl ether benzimidazole), a polyimide and copper and a process for making same. In addition, the present invention is directed to new species of poly(aryl ether benzimidazoles) which are employed in the formation of multilevel electronic packages.

2. Background of the Prior Art

Electronic packaging is commonly employed in electrical and electronic devices, assemblies, subassemblies, systems and the like. Usually, electronic packaging involves a multiplicity of layers, each layer of which includes one or more electrical circuits. Most commonly, a circuit or circuits is formed by copper wiring or metal deposition disposed on a layer of a polyimide which, in turn, is disposed upon a substrate.

In forming multilayer electronic packages a first polyimide precursor is disposed upon a substrate. That layer is thereupon cured to a polyimide. A patterned copper layer, defining an electrical circuit is embedded into the polyimide cured layer. The copper layer may be raised above or at the height of the polyimide where it is referred to as raised or planar, respectively. This procedure is repeated to form the multilayered package.

Although the use of these materials are most appropriate to this application, there are problems associated with their use. For one thing adhesion between copper and polyimides is poor. For another, copper reacts with polyimide precursors to form a fine precipitate of copper oxide particles within the polyimide layer. These two problems can be disastrous in electronic application insofar as both of these problems can lead to failure of the circuit. That is, poor adhesion can easily lead to discontinuity in the copper circuit based on the dislodging of all or part of the copper conduit paths. Similarly, the inclusion of free copper oxide particles increases the electrical conductivity of the polyimide which also leads to malfunction.

Many proposed solutions have been advanced to overcome these well understood problems. One such solution, advanced to overcome the reactivity and poor adhesion between copper and polyimides problems, is to contact these materials with chromium.

When chromium is employed in a copper-polyimide planar layer, a chromium layer is disposed thereover which prevents contact between the copper on the first layer with the polymide in the second layer. This results in a chromium-polyimide interface and because, as those skilled in the art are aware, there is good adhesion between chromium and a polyimide, the adhesion problem is alleviated. Moreover, chromium does not react with polyimides. As such, no reaction product of a chromium-containing compound is formed to disturb the electrical insulation between the layers.

Although this expedient is effective it is time consuming and expensive. It is even more time consuming and expensive when raised copper layers are involved. To cover the copper-polyimide layers, chromium must be sputter coated to provide a thickness of 200Å to 500Å followed by coating thereupon of the next polyimide layer. As those skilled in the art are aware, this involves the laying down of a film of a polyamic acid which thereupon is cured to form the polyimide.

An alternative to coating with chromium is to coat with tantalum. However, this change merely represents the substitution of one metal for another. The time duration, the complexity and the expense of this operation is unchanged.

Yet another solution is provided by the introduction of an electroless metal, usually nickel, to coat the copper and provide a barrier to its contact with the polyimide layer. This coating operation is technically difficult and is therefore costly. Moreover, the use of an electroless metal coating is oftentimes associated with an additional coating step, the coating of a silane coupling agent, which increases the complexity and expense of this alternative.

Other methods of overcoming the difficulties of copper-polyimide contact in multilevel electronic packages are provided by U.S. Pat. No. 3,770,573 to Lindsey and U.S. Pat. No. 3,361,589 to Dumphy et al. These patents, which are incorporated by reference, describe methods of chemically treating the surface of polyimide film layers which improve their adhesivity.

Other proposed solutions have been advanced. Suffice it to say, these solutions involve the use of adhesion promoting agents which suffer from incompatibility between their thermal, mechanical and/or electrical properties and those of the polyimide layers with which they are in contact.

For example, U.S. Pat. No. 4,048,005 to Nakagome et al. describes a process for producing a heat resistant laminated metallic sheet composed of mutually insulated outer metallic sheets or foils disposed between an inner binder layer of a film of a heat resistant heterocyclic polymer from which the volatile matter is substantially removed. The heterocyclic polymer may be a polyimide, a polyamide-imide, a polybenzimidazole, a polyhydantoin, a polyparabanic acid, a polythiazole or a polyimidozopyrrolidone.

Not only does the generalized nature of the polyimides within the contemplation of Nakagome et al. not specifically describe the particular polyarylene ether benzimidazoles of the present invention but, moreover, there is no disclosure of utilizing the polymers of this patent as an adhesive layer disposed between copper circuitry and an adjacent polyimide layer.

U.S. Pat. 5,180,639 to Zarnoch describes a method of modifying an aromatic polymer surface to improve the adhesion of that surface to a metal layer thereon. As such, this method is similar to the concept that has been suggested for overcoming the problems associated with poor adhesion between copper and polyimide layers.

Although the Zarnoch patent involves a method of modifying an aromatic polymer surface to improve the adhesion to a metal layer, the aromatic polymers described in Zarnoch are primarily polycarbonates which are subjected to nitration. The complexity of including chemical reaction, the nitration step, in the formation of the modified surface makes this process of this patent unfavorable.

U.S. Pat. No. 4,022,649 to Nakagome et al. discloses a method of producing a metal laminate which includes a polybenzimidazole layer. Although this patent deals with heterocyclic polymers of the type utilized in the present invention, the polymers utilized in the '649 patent are not used to cap the copper layer to prevent copper from reacting with polyamic acid. Thus, the '649 patent does not provide a teaching which results in enhanced adhesion of copper to polyimide.

U.S. Pat. No. 5,120,819 to Lubowitz et al. sets forth a class of crosslinkable oligomers that include oxazole, thiazole or imidazole linkages. It is emphasized, however, that the '819 patent does not disclose or suggest the use of the oligomers taught therein in the capping of copper. Neither does it disclose or suggest a process of manufacturing a multilayered electronic package.

U.S. Pat. No. 3,533,879 to Levine describes a process wherein fusible polybenzimidazoles impregnate fabrics permitting the formation of fabric laminates and the like. This patent provides no disclosure relating to an electrical multilayered article.

U.S. Pat. No. 3,957,726 to Gordon et al. discloses novel polyimides which polymers are described as useful in the formation of prepregs and laminates. None of the polymers, prepregs, films and laminates, disclosed as useful in the formation of prepregs and laminates, are described in Gordon et al. for use in the capping of copper, essential in the formation of multilayered electrical packages.

The above remarks establish the need in the art for a new multileveled electronic package and a process for forming the same, which insures adhesion of copper and which also is free of the problem associated with the formation of copper-containing precipitates, to thus minimize degradation of the dielectric in multilayered electronic packages.

SUMMARY OF THE INVENTION

A new multilayered package and a process for forming that package, useful in electronic multilevel packages, which eliminates the problems of precipitation of copper oxide and other copper-containing precipitates as well as poor adhesion of copper to a dielectric surface, has now been discovered. New polymers, furthermore, useful in overcoming these problems, associated with copper-polyimide interfaces in the prior art, have also been discovered.

In accordance with the present invention, a multilevel package, useful in microelectronic applications, is provided. The multileveled electronic package comprises at least two levels, each level including a polyimide, a poly (aryl ether benzimidazole) and copper.

In further accordance with the present invention, new poly(aryl ether benzimidazoles) useful in the manufacture of the aforementioned multilayered structure is set forth. These poly(arylene ether benzimidazoles) include those having the structural formulae

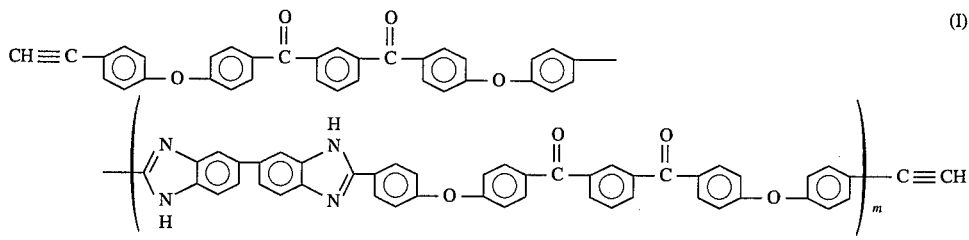

(I)

where m is an integer of at least about 2.

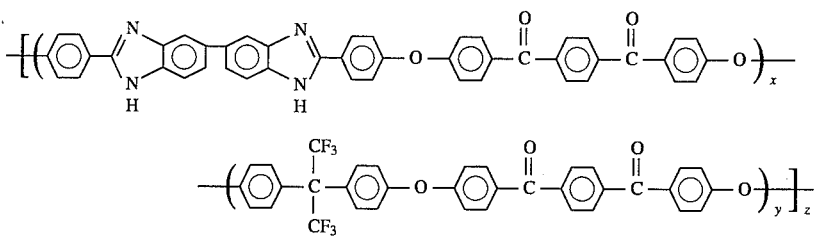

where x is at least about 0.1; y is at least about 0.1; with the proviso that the sum of x and y are at least about 1; and z is an integer of at least about 15;

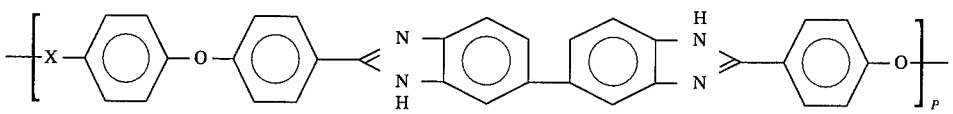

where X is

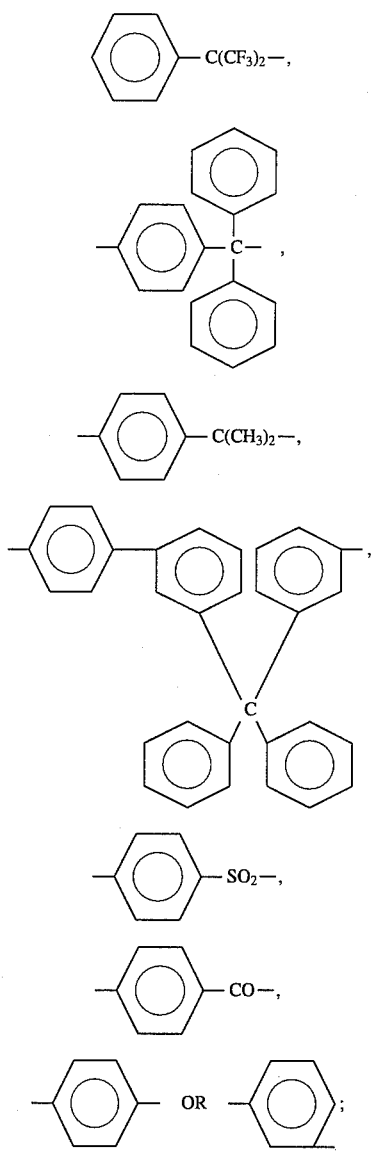

and p is an integer of at least about 15.

In further accordance with the present invention a process is provided for preparing a multilevel electronic package comprising disposing a layer of a solution of a poly(aryl ether benzimidazole) in an aprotic solvent over a substrate. This layer is heated to drive off the aprotic solvent. A coating of a polyamic acid is next added to the layer of the poly(aryl ether benzimidazole). The poly(aryl ether benzimidazole) is cured as is the polyamic acid which is chemically converted to the corresponding polyimide. Vias are formed in this cured product and copper is deposited therein to complete the formation a first level. At least one additional layer, initiated by the depositing of a solution of a poly(aryl ether) benzimidazole atop the first layer, is included in this process.

DETAILED DESCRIPTION

The multilayered package of the present invention is characterized by good adhesion between a dielectric and copper without the attendant problem, associated with formation of free compounds of copper, especially copper oxides, in the multilayered electronic packages of the prior art. This package includes, in addition to a polyimide dielectric and a copper conductor, a poly(aryl ether benzimidazole). Many of these poly(aryl ether benzimidazoles) are themselves novel. However, the use of any poly(aryl ether benzimidazole) in a multileveled electronic package with a polyimide and copper is new.

The advantage provided by employing a poly(aryl ether benzimidazole) with copper and a polyimide in this application resides in its adherence to both polyimides and copper to thus overcome the well known poor adhesion between copper and polyimides. Furthermore, poly(aryl ether benzimidazoles) provide a barrier between the polyimide precursor (polyamic acid) and copper during formation of multilevel packages to prevent formation of copper oxides. Thus, the presence of poly(aryl ether benzimidazoles) overcome the two principal problems associated with electronic multilevel packages of the prior art. Specifically, the above remarks explain how the bonding problem between polyimides and copper as well as the problem of the reaction of polyamic acid and copper is overcome by the disposition therebetween of a layer of poly(aryl ether benzimidazole) in the manufacture of multileveled packages. That is, the multilevel package manufacturing process eliminates, in the second and subsequent layers, contact between copper and polyamic acid.

In the present invention a multilevel electronic package is provided in which each level includes a poly(aryl ether benzimidazole), a polyimide and copper. Examples of multilevel packages include multichip modules, printed wiring boards, integrated circuit chips and backend of chips.

In preparing the multilayered package of the present invention, a new process is provided which includes a first step of disposing a coating of a poly(aryl ethyl benzimidazole) (PAEBI) upon a substrate. The PAEBI is provided in the form of a solution, usually in aprotic solvent, such as N-methyl pyrrolidone (NMP), dimethylpropylene urea (DMPU), cyclohexyl pyrrolidone (CHP), mixtures thereof and the like.

Although any PAEBI may be employed in the preparation of the package of this invention, certain specific PAEBI polymers are preferred. Many of these preferred polymers are new in the art.

One preferred PAEBI is the polymer having the structural formula

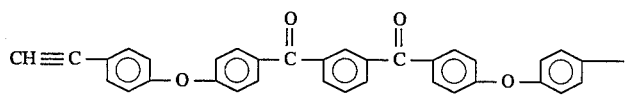

(I)

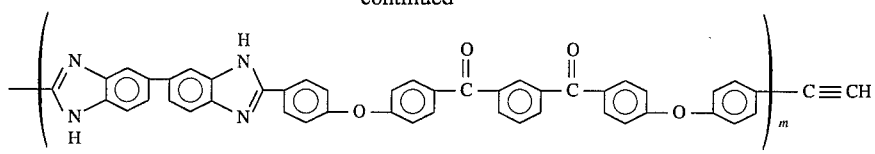

where n is an integer of at least about 15.

The PAEBI having the structural formula I is disclosed in Smith et al., *Polym. Prepr.*, 32 (3), 193 (1991). This preferred species of PAEBI is formed by reacting a stoichemetric excess of 1,3-bis(4-fluorobenzoyl)benzene with 5,5'-bis-2-(4-hydroxylphenyl)benzimidazole in the presence of anhydrous potassium carbonate in dimethyl acetate, preferably at 18% solids. In addition to the above reactants, 2-(4hydroxyphenyl)benzimidazole is used to endcap the polymer and is added at the beginning of the reaction.

Another PAEBI within the contemplation of the present invention is one having the structural formula

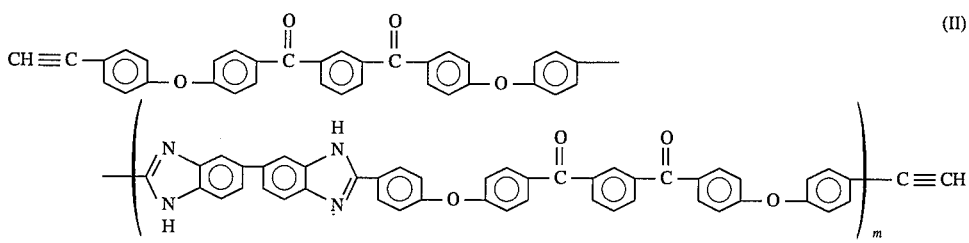

where m is an integer of at least about 2. More preferably m is an integer of between about 5 and about 15.

The PAEBI having the structural formula II is prepared by reacting 1,3-bis(4-fluoro-benzoyl)benzene with 5,5-bis(2-(4-hydroxyphenyl)benzimidazole in the presence of 4-hydroxyphenylacetylene at a temperature in the range of between about 140° C. and about 150° C. in a solution of dimethyl acetate (DMAc) and toluene under an inert atmosphere of nitrogen. The reaction furthermore occurs in the presence of a mild base, preferably amorphous potassium carbonate.

The new PAEBI having the structural formula II, although similar to the PAEBI having the structural formula I, insofar as it shares the physical characteristics of good thermal stability, low residual stress from thermal cycling, high modulus and elongation and exceptional adhesion to both polyimides and copper, the polymer having the structural formula II has an improved property provided by its end cap groups. That is, the acetylenic bonds therein permit easy crosslink curing by thermal means. This easy crosslinking enhances the cured polymer's mechanical properties.

Another PAEBI which may be utilized in the multilevel electronic package of the present invention is the copolymer having the repeating structural unit where x is at least about 0.1; y is at least about 0.1, with the proviso that the sum of x and y is at least 1; and z is an integer of at least about 15. Preferably, x is about 0.6 to about 0.8; y is between about 0.2 to about 0.4; and z is an integer of between about 20 and about 30.

The PAEBI polymer having the structural formula III is prepared by reacting 1,3-bis(4-fluorobenzoyl)benzene with 5,5'-bis-2-(4-hydroxyphenyl)benzimidazole in N-methyl pyrrolidone (NMP) and anhydrous $K_2CO_3$, similar to the method used to polymerize the PAEBI having the structural formula I. However, these polymerization reactants are supplemented with the inclusion of the compounds, Bisphenol-6F and 4,4'-difluorobenzophenone.

The polymer having the structural formula III provides an improvement over the PAEBI of formula I. That is, the copolymer of formula III has lower water uptake than does the PAEBI of formula I. Whereas the PAEBI of formula I has a water uptake of up to about 4% by weight, the water uptake of the PAEBI copolymer having the structural formula III is only about 0.4% by weight.

As those skilled in the art are aware, water has an adverse effect on the properties sought to be provided in the electronic multileveled package of the present invention. Specifically, water in PAEBI polymers reduces the polymer's adhesivity to other polymers and metals and reduces its barrier properties, permitting interaction between copper and polyimides.

Additional PAEBI polymers, useful in the multileveled electronic structure of the present invention, which are themselves new are the polymers having the structural formula

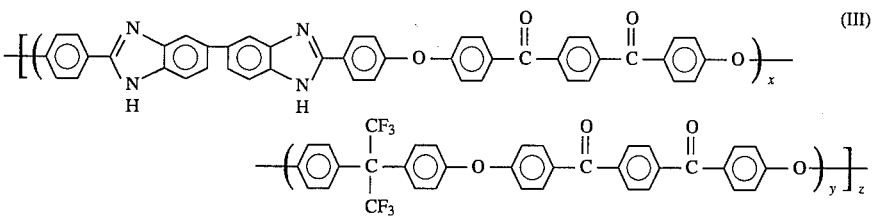

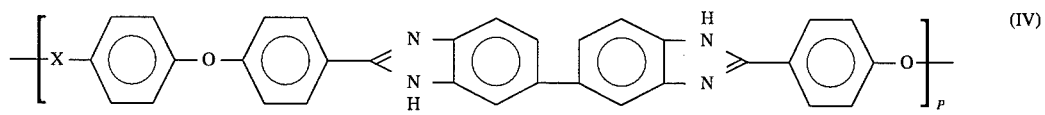

where X is

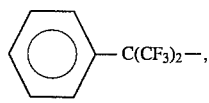

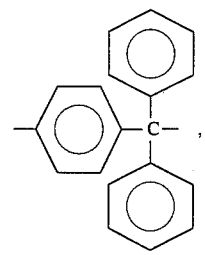

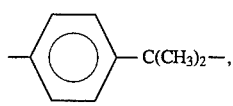

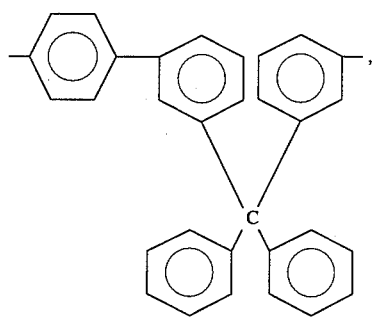

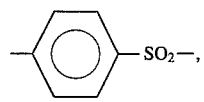

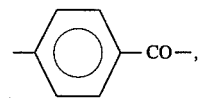

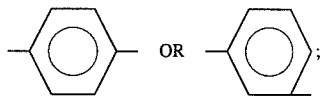

and p is an integer of at least about 15.

The PAEBI's having the structural formula IV are more soluble in aprotic solvents, such as NMP, DMPU and CHP, than are the earlier PAEBI's facilitating their utilization in multilevel electronic packages.

Polymers defined by structural formula IV are prepared by reacting 2,2'-bis(fluorophenyl)-6,6'-bibenzimidazole with the appropriate reactant, which defines the meaning of X, in the repeating structural unit. Thus, such bisphenols as Bisphenol A, Bisphenol AF bis (6-hydroxyphenyl)diphenylmethane and 9,9'-bis(hydroxyphenyl)fluorene may be employed. In addition, other reactants such as hydroquinone, resorcinol, dihydroxdiphenylsulfone and dihydroxylbenzophenone may also be used instead of the above mentioned bisphenols. This reaction occurs in an aprotic solvent in the presence of anhydrous potassium hydroxide as a base.

The product polymer having the structural formula IV is a high molecular weight polymer having an inherent viscosity of about 0.4 deciliters per gram and have a glass transition temperature in the range of between about 230° C. and about 260° C. However, these polymers are soluble in NMP up to as high a solids content as about 15% to about 25% by weight.

The PAEBI, disposed in solution form upon a substrate, is thereupon subjected to elevated temperature to drive off the solvent, usually comprising an aprotic solvent. Preferably, the PAEBI solution is exposed to a temperature of between about 70° C. and about 200° C. at atmospheric pressure. More preferably, this temperature is in the range of between about 85° C. and about 150° C.

The thus formed PAEBI layer is thereupon overcoated with a layer of polyamic acid. Polyamic acids are prepared as the product of a condensation reaction between a dianhydride and a diamine.

Polyamic acids may also be prepared as the condensation reaction between a diester-diacid or a diester-diacid dichloride and a diamine. Additionally, polyamic acids can be formed by the condensation reaction between a dianhydride and a diisocyanate. Other methods of preparing a polyamic acid, which, as will be discussed below, is a polyimide precursor, include the reaction of bis(carboethoxy)diimide with a diamine and the electrochemical reaction of aminophthalic acid.

Other methods of preparing polyimide precursors are provided in Kirk-Othermer, "Encyclopedia of Chemical Technology, Third Edition," Vol. 18, pp. 704–719 and the aforementioned U.S. Pat. No. 3,361,589 to Lindsey and U.S. Pat. No. 3,770,573 to Dumphy et al., all of which are incorporated herein by reference.

Polyamic acids are converted to the corresponding polyimide by being cured at elevated temperature. Usually, exposing a polyamic acid to a temperature in the range of between about 300° C. and about 400° C. at atmospheric pressure effects its curing to form a polyimide.

This temperature range also effects curing of PAEBI polymers. Therefore, the polyamic acid and PAEBI, disposed on the substrate, is subjected to heating in this temperature range resulting in the curing of these polymers. It is emphasized, however, that the polymers are cured randomly so that it cannot be said that distinct layers are formed, as in a classical laminate. Of course, this remote possibility is not excluded.

The thus cured product is next subjected to the step of forming the desired electrical circuit thereon. This is accomplished by lithographic methods known in the art wherein the desired circuit is etched, cut or otherwise provided in the cured polyimide-PAEBI surface in the form of vias. Finally, a first layer of the multileveled package is completed by depositing copper into the vias by methods again well known in the art.

A second layer is then prepared by repeating the above process. Again a first layer of a PAEBI in solution initiates the preparation. The instant process thus insures that the copper present in the first layer is not exposed to polyamic acid with which it reacts due to the protective layer of PAEBI disposed over exposed copper before the subsequent coating with a new layer of a polyamic acid. Furthermore, the presence of PAEBI throughout the layer insures good adhesion to copper. As will be demonstrated to both copper and in the examples, PAEBI also exhibits good adhesion to both copper and polyimides.

The following examples are given to illustrate the present invention. Because these examples are given for illustrative purposes only, the present invention should not be limited thereto.

EXAMPLE 1

Preparation of a Material Containing Copper, a Polyimide and a Poly(aryl ether benzimidazole)

The surface of a thin copper foil was cleaned with dilute acetic acid. The cleaned copper surface was coated with a solution of a PAEBI having the structural formula I dissolved in a mixed cyclopentanone-NMP solvent present in a weight ratio of 60:40. After a uniform 0.1 micron thick layer of the PAEBI was disposed on the copper foil and soft baked at 150° C., poly(biphenyl dianhydride-p-phenylene diamine) (BPDA-PDA) was coated upon the PAEBI layer. The PAEBI and polyamic acid, i.e. (BPDA-PDA), were cured by exposure to a temperature of 85° C. for 30 minutes followed by heating at a temperature of 150° C. for 30 minutes. The polymers were then heated for 30 minutes at 230° C., then for 30 minutes at 300° C. and finally for 1 hour at 400° C.

EXAMPLE 2

Adhesivity of PAEBI to Copper

A 10 micron layer of copper was disposed over a substrate. The layer was, in turn, coated with a solution of PAEBI having the structural formula I dissolved in a 60:40 cyclopentanone-NMP solvent mixture and soft baked at 150° C. for 1 hour. A layer of BPDA-PDA was disposed onto the PAEBI layer, as in Example 1, and then the two polymers were simultaneously cured in accordance with the procedure set forth in Example 1.

The result was a cured polymeric layer, 20 microns thick, disposed over the 10 microns thick copper layer. Since the PAEBI layer was separately applied prior to the polyamic acid, two layers formed in the 20 micron thick polymer layer. Because PAEBI was initially disposed over the copper layer it was the bottom layer, in contact with the copper layer.

Sample strips 5 mm wide were cut from the thus formed structure. The polymeric layer was peeled from the copper layer employing an Instron [trademark] machine by a method well known in the art. Upon the testing of several samples it was determined that the peel strength, required to separate the PAEBI layer from the copper layer, ranged from 80 to 90 g/mm. That is, statistical analysis established this range to represent the quantitative adhesivity between PAEBI and copper.

EXAMPLE 3

Adhesivity of PAEBI to a Polyimide

A cured 10 micron layer of the polyimide utilized in Examples 1 and 2 was formed on a substrate by thermal curing in accordance with the procedure mentioned therein. The cured polyimide layer was subsequently modified with KOH followed by modification with acetic acid, then rinsed with water and isopropyl alcohol to produce a 10 micron thick layer of the cured polyimide.

Thereupon, 20 micron thick layer of cured PAEBI and polyimide, identical to that disposed over the 10 micron thick copper layer in Example 2, was prepared in an identical manner to the preparation of that layer in Example 2.

As in Example 2, the fact that PAEBI was the first applied polymer over the cured polyimide resulted in the PAEBI layer being disposed atop the 10 micron polyimide layer. Thus, the adhesivity of PAEBI to polyimide was determined again by measurement of The peel strength required to separate these layers.

That is, in identical fashion to Example 2, an Instron [trademark] machine was employed to measure the force required to peel 5 mm strip samples of adjoining polymeric layers. It was found that the peel strength of PAEBI to polyimide was, over the average of several samples, 98 g/mm.

EXAMPLE 4

Diffusion Barrier Characteristics of PAEBI

A cross section of the copper-polymer interface of a cured sample of Example 2 was investigated using Transmittance Electron Microscopy (TEM). It was found that the polymer contained no copper-containing precipitate. It was thus concluded that PAEBI, disposed between the copper and polyimide layers, acted as a barrier preventing contact between the layers which it separated.

EXAMPLE 5

Preparation of the PAEBI Having the Structural Formula II 1,3-Bis(4-fluorobenzoyl)benzene was reacted with 5,5'-bis(2-(4-hydroxyphenyl)benzimidazole) in the presence of 4-hydroxyphenyl acetylene. This polymerization reaction occurred in the presence of a DMAc-toluene mixed solvent under a temperature of 155° C. and in the presence of potassium carbonate.

The resultant product, PAEBI having the structural formula II.

EXAMPLE 6

Preparation of the PAEBI Having the Structural Formula III 1,3-Bis(4-fluorobenzoyl)benzene was reacted with Bisphenol AF in the presence of 4,4'-difluorobenzophenone. This reaction took place in an NMP solution at a temperature of 175° C. at atmospheric pressure.

The product of this reaction was a polymer having the structural formula III. This polymer was characterized by an intrinsic viscosity of 0.45 deciliter per gram, as measured at 25° C. in NMP.

EXAMPLE 7

Preparation of PAEBI's Having the Structural Formula IV 2,2'-Bis(fluorophenyl)-6,6'-bibenzimidazole was separately in Bisphenol AF, bis(6-hydroxyphenyl)-diphenyl-methane, 9,9'-bis(hydroxyphenyl)fluorene and Bisphenol A. Each of these reactions took place in a dimethylpropylene urea and/or mixed N-methylpyrrolidonecyclohexyl pyrrolidone solution.

The polymeric product of these reactions had the structural formula IV where X has the meanings given in Table 1 below. Table 1 also includes the characterizing physical properties glass transition temperature and intrinsic viscosity, measured in NMP at 25° C., for the PAEBI products.

TABLE 1

| Bisphenol | Poly. Solvent | X | Tg, °C. | $[Tg]^{25° C.}$ NMP dl/g |
|---|---|---|---|---|
| Bisphenol AF | DMPU | —⟨C₆H₄⟩—C(CF₃)₂— | 218 | 0.45 |
| Bisphenol AF | NMP/CHP |  |  | 0.46 |
| bis(6-hydroxyphenyl)diphenylmethane | DMPU | —⟨C₆H₄⟩—C(Ph)₂— | 228 | 0.36 |
| bis(6-hydroxyphenyl)diphenylmethane | NMP/CHP |  |  | 0.44 |
| 9,9'-bis(hydroxyphenyl)fluorene | DMPU | —⟨C₆H₄⟩—C(fluorene)— | 250 | 0.43 |
| 9,9'-bis(hydroxyphenyl)fluorene | NMP/CHP |  |  | 0.44 |
| Bisphenol A | NMP/CHP | —⟨C₆H₄⟩—C(CH₃)₂— |  | 0.38 |

The above embodiments and examples will make apparent, to those skilled in the art, other embodiments and example. These other embodiments and examples are within the contemplation of the present invention. Therefore, the present invention should be limited only by the appended claims.

What is claimed is:

1. A process of making a multileveled electronic package comprising the steps of:
   (a) depositing a layer of poly(aryl ether benzimidazole), in the form of a solution, over a substrate;
   (b) heating said poly(aryl ether benzimidazole) layer to drive off said solvent;
   (c) adding a coating of polyamic acid to said layer of said poly(aryl ether benzimidazole) whereby a product is formed;
   (d) heating said product of step (c) whereby said poly(aryl ether benzimidazole) is cured and said polymeric acid is converted to a cured polyimide to provide a randomly cured product;
   (e) forming vias in said randomly cured product of step (d);
   (f) depositing copper in said vias to complete a first layer; and
   (g) repeating steps (a) to (f) whereby a second layer is formed.

2. A process in accordance with claim 1 wherein said step (d) of heating poly(aryl ether benzimidazole) and said polyamic acid to form said cured polyimide occurs at a temperature of between about 300° C. and about 400° C.

3. A process in accordance with claim 2 wherein said solvent of said poly(aryl ether benzimidazole) solution in said step (a) includes an aprotic solvent.

4. A process in accordance with claim 3 wherein said heating step (b) occurs at a temperature in the range of between about 70° C. and about 200° C.

5. A process in accordance with claim 1 wherein said poly(aryl ether benzimidazole) has the structural formula

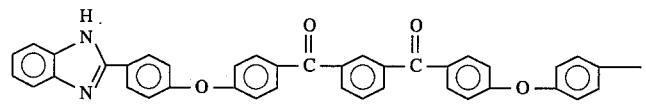

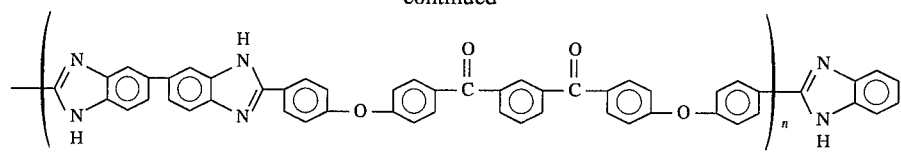

where n is an integer of at least about 15.

6. A process in accordance with claim 1 wherein aid poly(aryl ether benzimidazole) has the structural formula

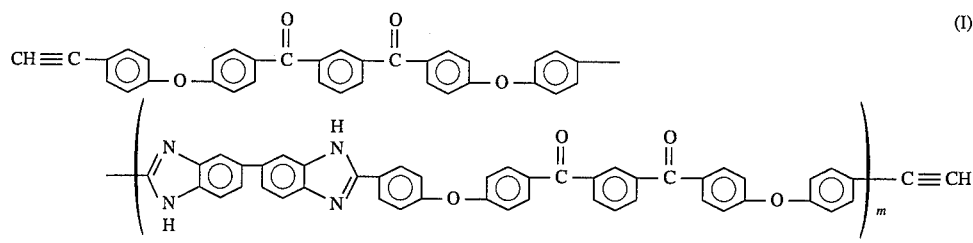

(I)

where m is an integer of at least about 2.

7. A process in accordance with claim 1 wherein said poly(aryl ether benzimidazole) has the structural formula

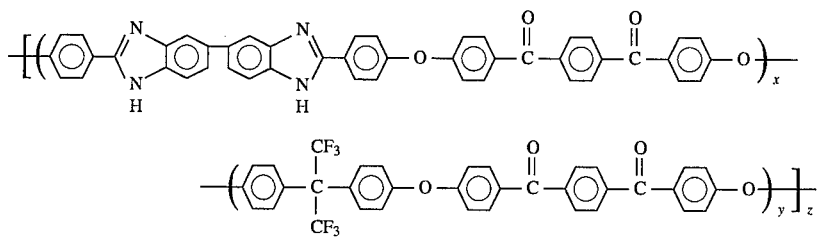

where x is at least about 0.1; y is at least about 0.1, with the proviso that the sum of x and y is at least about 1; and z is an integer of at least about 15.

8. A process in accordance with claim 1 wherein said poly(aryl ether benzimidazole) has the structural formula

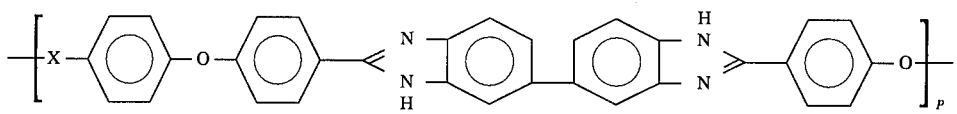

where X is

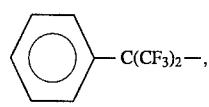

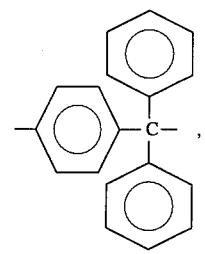

17
-continued
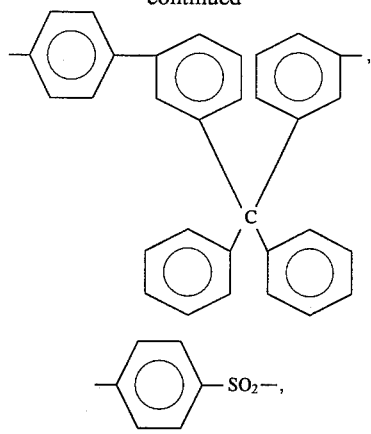
18
-continued
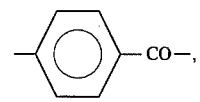
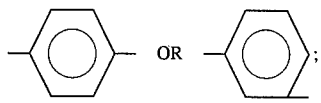
and p is an integer of at least about 15.
* * * * *

UNITED STATES PATENT AND TRADEMARK OFFICE
CERTIFICATE OF CORRECTION

PATENT NO. : 5,593,720
DATED : January 14, 1997
INVENTOR(S) : Kie Y. Ahn, et al.

It is certified that error appears in the above-indentified patent and that said Letters Patent is hereby corrected as shown below:

Column 6, line 44: "ethyl" should read --ether--

Column 7, line 17: "4hydroxyphenyl" should read --4-hydroxyphenyl--

Column 16, line 55: "  "

should read -- 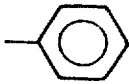 --

Signed and Sealed this

Twenty-third Day of June, 1998

Attest:

BRUCE LEHMAN

Attesting Officer    Commissioner of Patents and Trademarks